(12) United States Patent
Tang (10) Patent No.: US 10,593,746 B2
(45) Date of Patent: Mar. 17, 2020

(54) SPLICED DISPLAY DEVICE

(71) Applicant: Wuhan China Star Optoelectronics Technology Co., Ltd., Wuhan, Hubei (CN)

(72) Inventor: Yuejun Tang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 186 days.

(21) Appl. No.: 15/749,438

(22) PCT Filed: Dec. 19, 2017

(86) PCT No.: PCT/CN2017/117236
§ 371 (c)(1),
(2) Date: Jan. 31, 2018

(87) PCT Pub. No.: WO2019/085195
PCT Pub. Date: May 9, 2019

(65) Prior Publication Data
US 2019/0131381 A1     May 2, 2019

(30) Foreign Application Priority Data

Oct. 30, 2017 (CN) .......................... 2017 1 1035118

(51) Int. Cl.
*H01L 27/32* (2006.01)
*H01L 51/00* (2006.01)

(52) U.S. Cl.
CPC ...... *H01L 27/3293* (2013.01); *H01L 51/0097* (2013.01); *H01L 2251/5338* (2013.01)

(58) Field of Classification Search
CPC .................................................. H01L 27/3293
See application file for complete search history.

(56) References Cited

U.S. PATENT DOCUMENTS

| | | | |
|---|---|---|---|
| 2016/0274391 A1 | 9/2016 | Kang et al. | |
| 2017/0032763 A1* | 2/2017 | Cheong | G09G 3/3225 |

FOREIGN PATENT DOCUMENTS

| | | |
|---|---|---|
| CN | 103578371 A | 2/2014 |
| CN | 103676237 A | 3/2014 |

(Continued)

*Primary Examiner* — Douglas M Menz
(74) *Attorney, Agent, or Firm* — Hemisphere Law, PLLC; Zhigang Ma (57) ABSTRACT

The spliced display device comprising a plurality of display panels stitched to each other, and each of display panels has display region and non-display region. The spliced display device comprises at least one first display panel and at least one second display panel. An end of first display is backwardly bended away display surface at boundary between display region and non-display region. An end of second display panel is adjacent to first display panel and end of second display panel facing and correspondingly fixed to non-display region of first display panel after been bended. The spliced display device provides at least one non-display region is bended and stitched to other display panel. It closing the distant between the display regions of two adjacent display panels, and achieves to narrow down or even eliminates seam of spliced display device, and improve sense of segmental image vision.

9 Claims, 5 Drawing Sheets

(56) References Cited

FOREIGN PATENT DOCUMENTS

| | | |
|---|---|---|
| CN | 104269428 A | 1/2015 |
| CN | 104318864 A | 1/2015 |
| CN | 104407465 A | 3/2015 |
| CN | 104766545 A | 7/2015 |
| CN | 105209967 A | 12/2015 |
| CN | 105976718 A | 9/2016 |
| CN | 106782132 A | 5/2017 |

* cited by examiner

SPLICED DISPLAY DEVICE

RELATED APPLICATIONS

The present application is a National Phase of International Application Number PCT/CN2017/117236, filed Dec. 19, 2017, and claims the priority of China Application 201711035118.8, filed Oct. 30, 2017.

BACKGROUND OF THE INVENTION

1. Field of the Invention

The disclosure relates to a spliced display technical field, and more particularly to a spliced display device.

2. The Related Arts

With the rapid development of large scale LCD (Liquid Crystal Display)/AMOLED (Active-matrix organic light emitting diode) industry, the LCD/AMOLED gradually becomes the trend of display technology due to its many advantages such as ultra-thin, light weight, radiation less, stable performance or the like. Currently, large scale LCD/AMOLED could be manufactured for 60 inches to 100 inches, but it still hardly satisfy the special requirements (for example, monitoring and dispatching), and it is difficult to ensure the yield of the super large scale LCD/AMOLED panel.

Because of the requirement of surrounding circuit layout, sealant, package design and so on in the existing LCD/AMOLED display, there inevitably appears the region cannot be displayed which around the display image. The non-display region is called the frame, and the image will be separated by frame during splicing, and destroyed the continuity and completeness of the image, which is seriously affected of splicing efficacy.

SUMMARY

A technical problem to be solved by the disclosure is to provide a spliced display device has relatively narrow splicing gap for ensure continuity and integrity of the image display An objective of the disclosure is achieved by following embodiments. In particular, a spliced display device includes a plurality of display panel.

The spliced display device comprising a plurality of display panels stitched to each other, and each of the display panels has a display region and a non-display region. The spliced display device comprises at least one first display panel and at least one second display panel, an end of the first display is backwardly bended away display surface at a boundary between the display region and the non-display region, and an end of the second display panel is adjacent to the first display panel, and the end of the second display panel facing and correspondingly fixed to the non-display region of the first display panel after been bended.

In an embodiment, a substrate positioned on bottom of the first display panel and/or the second display panel is flexible substrate.

In an embodiment, the first display panel is organic-light-emitting display panel, which comprises a substrate, an organic light emitting layer positioned on the substrate, and a package layer for packaging the organic light emitting layer on surface of the substrate.

In an embodiment, the organic light emitting layer is positioned in the display region of the first display panel; the end of the second display panel is facing to the bended package layer of the first display panel.

In an embodiment, adherence area between the package layers of a bending parts of the first display panels is greater than area of a non-bending part of the first display panel.

In an embodiment, the end of the second display panel which adjacent to the first display panel is backwardly bended away display surface at boundary between the display region and the non-display region, and the non-display region of the first display panel and the non-display region of the second display panel are facing and correspondingly fixed to each other after respectively bended.

Or, the display region of the second display panel is coplanar with the non-display region of the second display panel, the non-display region of the end of the first display panel is formed a step part after been bended twice, and the second display panel mating to the step part and the end of the second display panel is facing to a sidewall of the step part.

In an embodiment, the spliced display device further comprises a conductive element, two bending parts of the substrates of the display panels are corresponding to each other and respectively has a first bound part, the conductive element is connected between the two adjacent first bound parts of the substrates.

In an embodiment, the spliced display device further comprises a second bound part positioned away splicing portion on the substrate of periphery of the display panel, the conductive element is positioned between same rows or same columns of the display panels.

In an embodiment, the second bound part is positioned on two adjacent lateral sides of the spliced display device.

The spliced display device in the present invention provides at least one non-display region is bended and stitched to other display panel. It closing the distant between the display regions of two adjacent display panels, and achieves to narrow down or even eliminates seam of the spliced display device, and improve sense of segmental image vision.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF THE PREFERRED EMBODIMENTS

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure.

Further, some of the terms above may be used in addition to the orientation or positional relationship represent, may also be used to indicate other meanings, such as "on" in some cases the term may also be used to express some dependency or connection relationship. For those of ordinary skill in the art, the meaning of these terms will be understood in the present invention depending on the circumstances.

The specific structural and functional details disclosed herein are only representative and are intended for describing exemplary embodiments of the disclosure. However, the disclosure can be embodied in many forms of substitution, and should not be interpreted as merely limited to the embodiments described herein.

Embodiment 1

Figure 1:
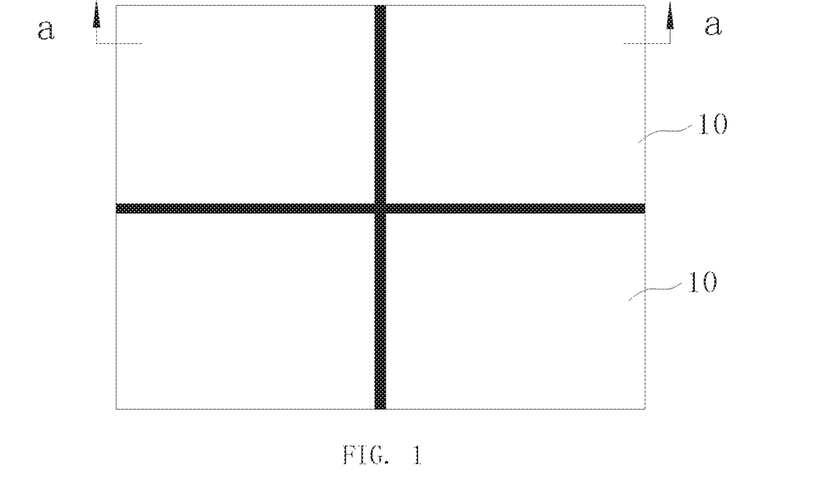
FIG. 1 is a result view of a spliced display device to an first embodiment of the disclosure.
Figure 2:
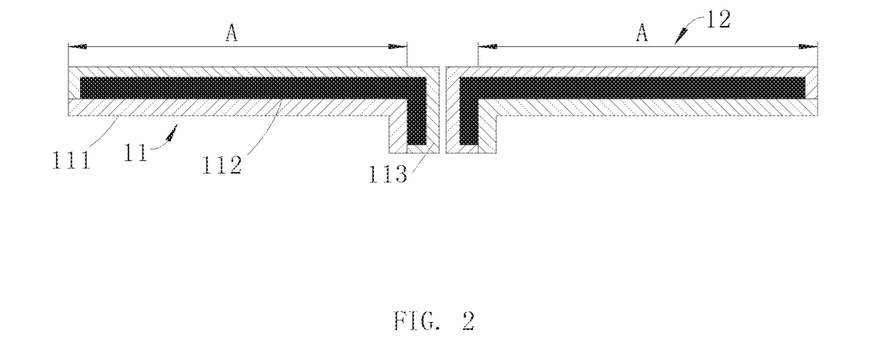
FIG. 2 is a splicing state schematic view of a display panel according to the first embodiment of the disclosure.
Figure 3:
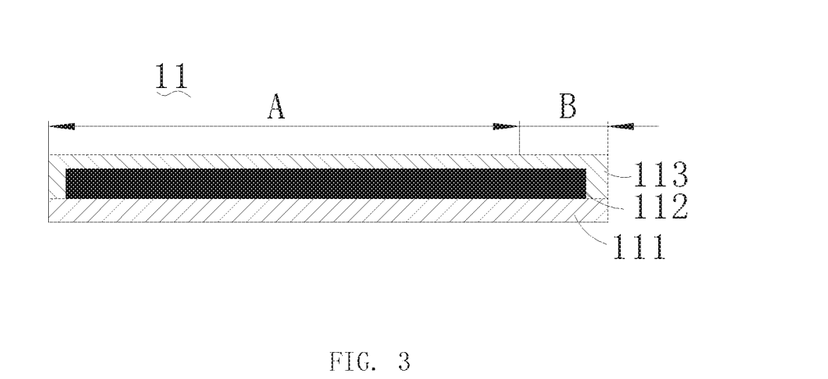
FIG. 3 is a structural schematic view of the display panel of the FIG. 2 before bended.

Please refer to FIG. 1 to FIG. 3. The spliced display device of the embodiment comprising a plurality of display panel 10 stitched to each other, and each of the display panel has a display region A and a non-display region B. All of the display regions A of the display panel are coplanar after the display panel stitching to each other. The spliced display device comprises at least one first display panel 11 and at least one second display panel 12. An end of the first display 11 is backwardly bended away a display surface at boundary between the display region A and the non-display region B, and an end of the second display panel 12 is adjacent to the first display panel 11, and an end of the second display panel 12 is facing and correspondingly fixed to the non-display region B of the first display panel 11 after been bended.

Because of at least one non-display region of display panel is bended and stitched to other display panel, it closing distance between the display regions of two adjacent display panels. It can achieve to narrow down or even eliminates seam of the display panel, and improve sense of segmental image vision.

For convenience of description, in this embodiment, all of display panel is OLED (organic-light-emitting) display panel as an example. It can be realized that the display panel 10 also could be a non-flexible display panel stitched to a flexible display panel.

Please refer to FIG. 2 and FIG. 3. FIG. 2 is a cross sectional view of a-a direction shown in FIG. 1. FIG. 3 is a structural schematic view of a first display device panel 11 before bending. The first display panel 11 comprises a substrate 111, an organic light emitting layer 112 positioned on the substrate 111, and a package layer 113 for packaging the organic light emitting layer 112 on surface of the substrate 111. It could be realized, inner structure of the first display panel 11 is not be limited to above description, for example further comprises anode, cathode and so on. In the FIG. 2, even though the organic light emitting layer 112 of the display panel in the bending portion is positioned under the seam, the width of the organic light emitting layer 112 of the bending portion is predetermine at this time, such that it not effects display of the spliced display device. Or, the bending part has the organic light emitting layer 112 is the non-display region according to predetermine by driving system, and this portion would not cause defects or other affection.

In this embodiment, structure of the second display panel 12 as same as structure of the first display panel 11, which is, an end of the second display panel 12 which adjacent to the first display panel 11 is backwardly bended away the display surface at boundary between the display region A and the non-display region B. And the non-display region B of the first display panel 11 and the non-display region B of the second display panel 12 are facing and correspondingly fixed to each other after respectively bended.

The substrate 111 positioned on bottom of the first display panel 11 and/or the second display panel 12 is flexible substrate, such that the first display panel 11 and the second display panel 12 could be bended according to requirement. The substrate 111 has property of high heat resistance and persistence, and made by one or more of polyethylene terephthalate, Polyethylene naphthalene-2,6-dicarboxylate, polycarbonate, Polyarylate, polyetherimide, polyethersulfone and polyimide.

Please refer to FIG. 3. When the first display panel 11 is not bended, partial edge of the organic light emitting layer 112 is located in the non-display region B. After the first display panel 11 been bended, the first display panel 11 is stitched to the second display panel 12, the package layer 113 of bending part of the first display panel 11 is facing with the package layer 113 of bending part of the second display panel 12, and then fixed both together. At this time, width of seam formed by the first display panel 11 and the second display panel 12 is sum of thickness of the organic light emitting layer 112 of the first display panel 11, thickness of the package layer 113 and thickness of the organic light emitting layer 112 of the second display panel 12, thickness of the package layer 113.

Figure 4:
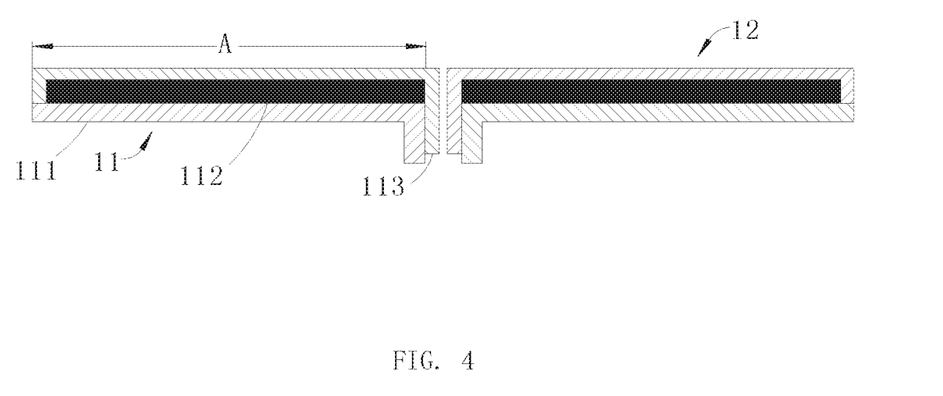
FIG. 4 is a splicing state schematic view of another display panel according to the first embodiment of the disclosure.
Figure 5:
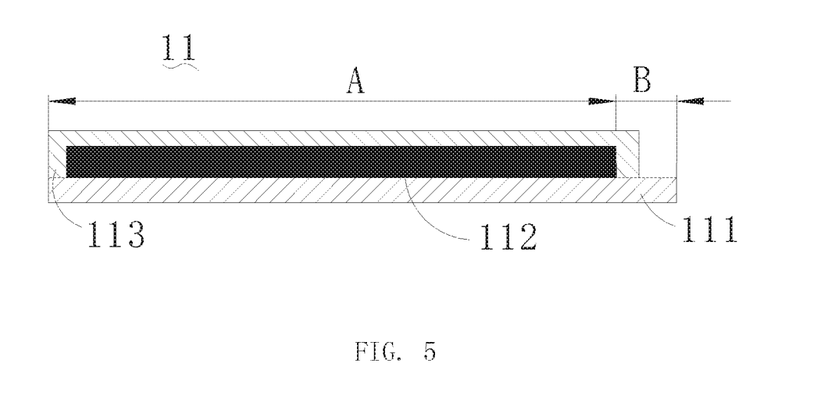
FIG. 5 is a structural schematic view of the display panel of the FIG. 4 before bended.

Please refer to FIG. 4 and FIG. 5. In this embodiment, structure of display panel is difference to the display panel shown as FIG. 2 and FIG. 3. In this embodiment, the organic light emitting layer 112 is positioned in display region A of the first display panel 11. The bended package layer 13 of the second display panel 12 is corresponding to the bended package layer 13 of the first display panel 11 when the first display panel 11 and the second display panel 12 are bended and stitched to each other. At this time, width of seam formed by the first display panel 11 and the second display panel 12 is sum of thickness of the package layer 113 of the first display panel 11 and thickness of the package layer 113 of the second display panel 12. Comparing with above embodiment, the width of seam significantly decreasing. In order to prevent the bending part damages the contact and adhesion between the package layer 113 and substrate 111 after been bended, the adherence area of the package layer 113 of bending part of the first display panel is greater than area of the non-bending part of the first display panel 11. For example, the width of the adherence 113 of the package layer 113 of the bending lateral side or the width of the frame is greater than other portion.

Embodiment 2

Figure 6A:
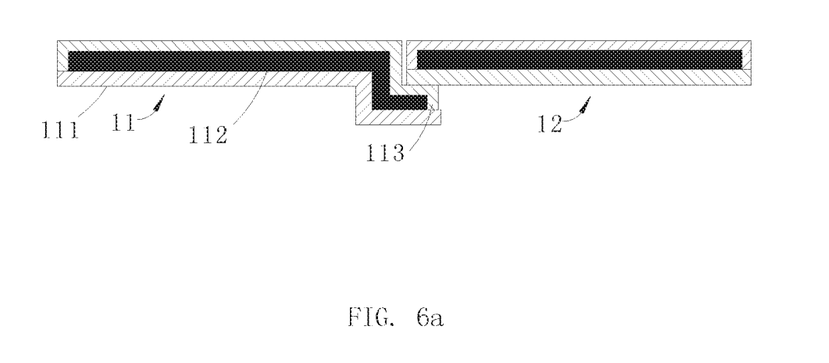
FIG. 6a is a splicing state schematic view of a display panel according to a second embodiment of the disclosure.
Figure 6B:
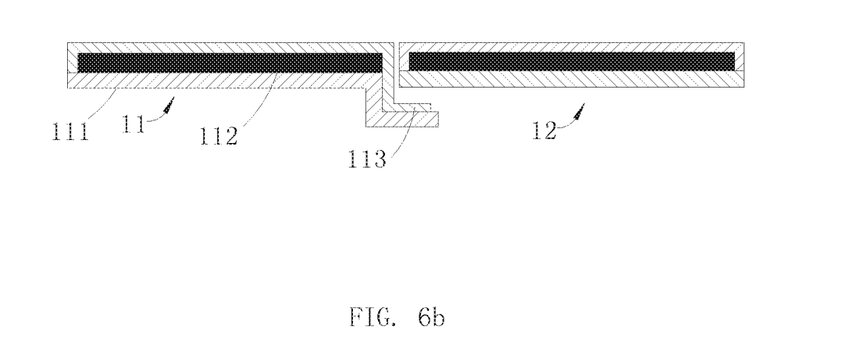
FIG. 6b is a splicing state schematic view of another display panel according to the second embodiment of the disclosure.

Please refer to FIG. 6a and FIG. 6b, the differences between with the embodiment 1 will be explained below. The second display panel 12 in this embodiment, the display region A is coplanar with the non-display region B. The non-display region B of an end of the first display panel 11 is formed a step part after been bended twice; the second display panel 12 is mating to the step part and the end of the second display panel 12 facing to a sidewall of the step part. Comparing with the first embodiment, this embodiment only narrow down gap from the first display panel 11 side.

In this embodiment, it cloud be applied to the stitching process for flexible display panel and non-flexible display panel. The first display panel 11 is a flexible display panel and the second display panel 12 is a non-flexible display panel, which enhances diversification of splicing way. In this embodiment, width of seam formed by the first display panel 11 and the second display panel 12 is sum of thickness of the organic light emitting layer 112 of the first display panel 11, thickness of the package layer 113, and width of frame of the second display panel 12.

Embodiment 3

Figure 7:
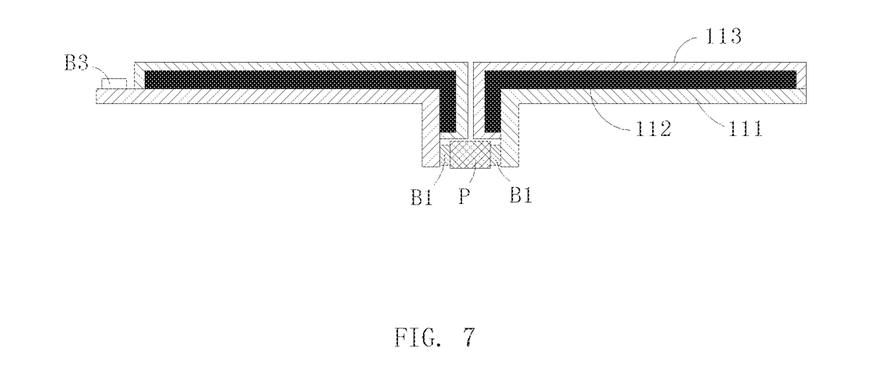
FIG. 7 is a splicing state schematic view of a display panel according to the a embodiment of the disclosure.
Figure 8:
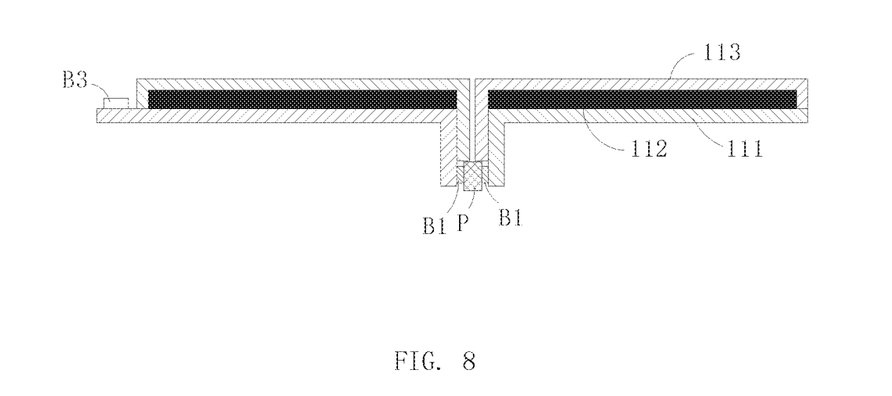
FIG. 8 is a splicing state schematic view of another display panel according to the third embodiment of the disclosure.

Please refer to FIG. 7 and FIG. 8, the differences between with the embodiment 1 will be explained below. Based on the embodiment 1, length of bending parts of substrates 111 of the first display panel 11 and the second display panel 12 are greater than covering width of the package layers 113 of the frame portion. The first display panel 11 is stitched to the second display panel 12, and the bending parts of the substrates 111 are correspondingly positioned to each other and respectively have the first bound parts B1 on the ends. The first bound part B1 bounding a bound terminal of the signal line which is correspondingly conducting to scan line, data line, source line, it could use for inputting, outputting and transferring the signals of the signal line. The conductive element P is electrically connected between first bound terminals B1 of two adjacent substrates 111 for transporting display signal. The conductive element P is anisotropic conductive adhesive, only conducting for Z-axis direction which is thickness direction of conductive element P and avoiding short circuit between different terminals.

It could reduces number of signal input terminal of the spliced display device and simplify circuit of the spliced display panel by using anisotropic conductive adhesive for conducting signal terminal between display panel 10.

Figure 9:
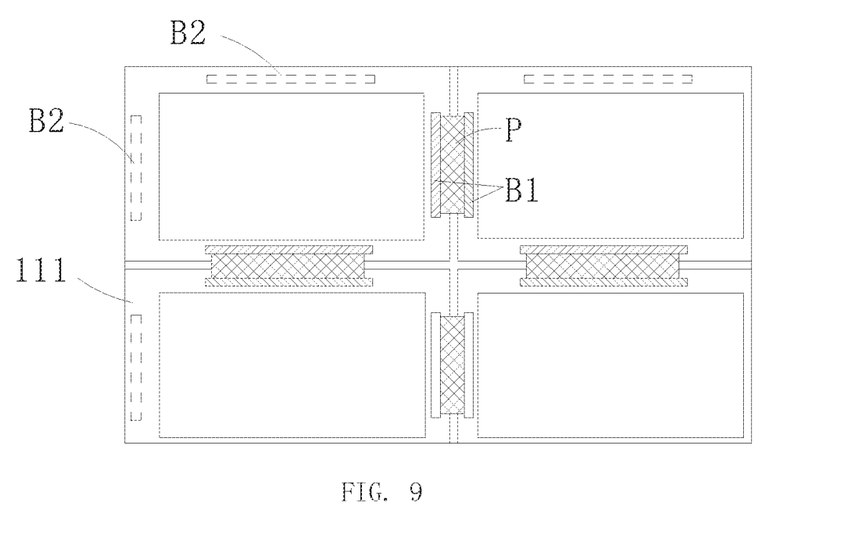
FIG. 9 is a backside structural schematic view of a first kind of spliced display device according to the third embodiment of the disclosure.
Figure 10:
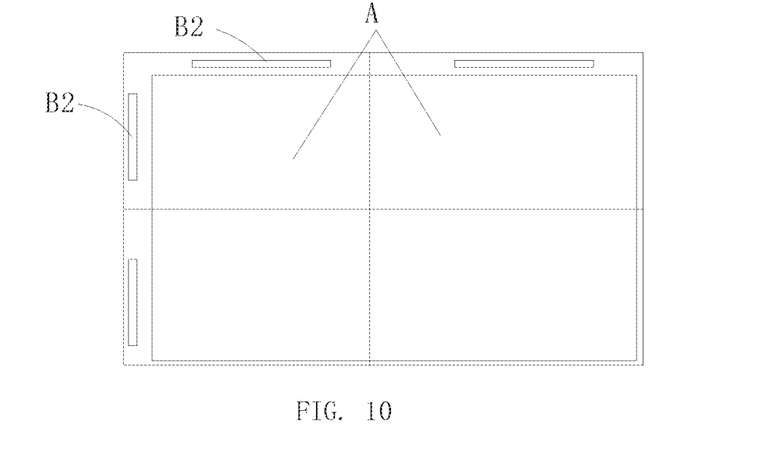
FIG. 10 is a front structural schematic view of a first kind of spliced display device according to the third embodiment of the disclosure.

Please refer to FIG. 9 and FIG. 10. In this embodiment, the conductive element P is connected between the two adjacent display panels 10 for connecting the first bound parts B1 of two adjacent display panels 10. The spliced display device further comprises a second bound part B2 is positioned away splicing portion on the substrate 111 of periphery of the display panel 10, and second bound part B2 is positioned on two adjacent lateral sides of the spliced display device. The upper side second bound part B2 is used for data signal driver terminal and the left side second bound part B2 is used for scan signal driver terminal. The sizes of pixels are designed to the same or similar by design the same resolution for all panels. The second bound part B2 in horizontal direction is a scan signal driver, and same row of the display panel 10 in horizontal direction has same number of scan lines and share with scan drive signal, the scan lines are respectively corresponding and connected with the conductive element P in the same row display panel 10. The second bound part B2 in vertical direction is a data signal driver, and same column of the display panel 10 in vertical direction has same number of data lines and share with data drive signal, the data lines are respectively corresponding and connected with the conductive element P. The spliced display device could provide a whole display panel after stitched to each other. When inputting the data driver signal and the scan drive signal, sequentially driving from the up to down or from the down to up in a frame image, and the display panels 10 in same row are simultaneously be drive.

Figure 11:
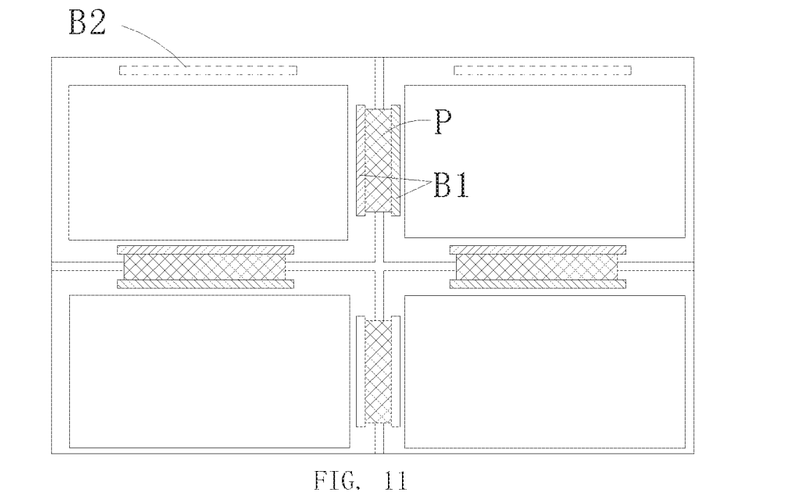
FIG. 11 is a backside structural schematic view of a second kind of spliced display device according to the third embodiment of the disclosure.

Please refer to FIG. 11, the second bound part B2 also could be positioned only on one side of spliced display device. For example, the second bound part is positioned on the upper side of the drawing, a integrate driver chip is positioned on the same side of the spliced display device, it could control to input and stop the signal form scan line, data line at the same time, which could also to narrow the edge frame of the spliced display device.

Figure 12:
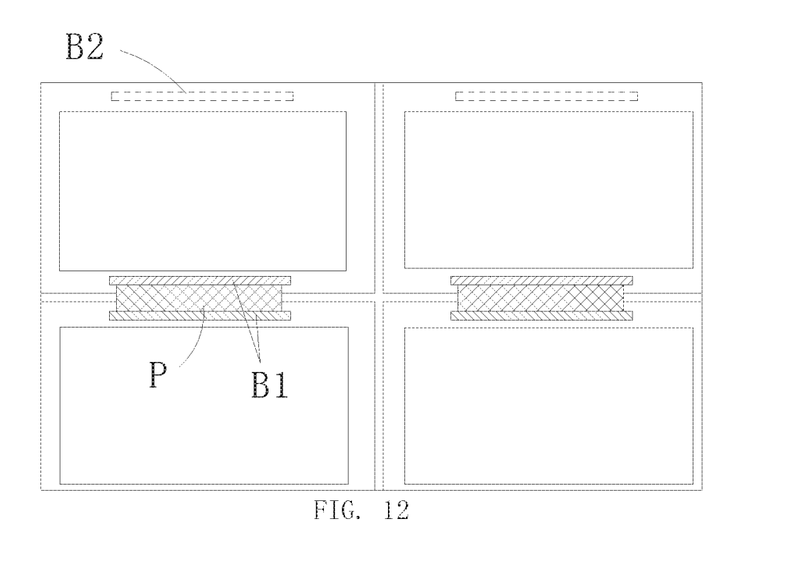
FIG. 12 is a backside structural schematic view of a third kind of spliced display device according to the third embodiment of the disclosure.

Please refer to FIG. 12. In this embodiment, the second bound part B2 is only positioned on one side of the spliced display device, and positioning conductive element P which connecting the first bound parts B1 of two display panel 10 between two display panels 10 only in vertical direction, at the same time the second bond part B2 is integrate driver chip, it could control to input and stop the signal form scan line, data line at the same time. It cause the same column of display panels 10 share with same signal inputting and the second bound part B2 in vertical direction, and the same row of display panels 10 are respectively using different scan drive signals. When inputting the data drive signal and the scan drive signal, the displays and drives will be together in the same column of display panels 10, and the displays and drives will be individual in different columns of display panels 10.

The spliced display device in the present invention, which provides at least one non-display region been bended and stitched to other display panel. It closing the distant between the display regions of two adjacent display panel, and it can achieve to narrow down or even eliminates seam of the spliced display device, and improve sense of segmental image vision. Simultaneously, It could reduces number of signal input terminals of the spliced display device and integrated circuit, and simplify circuit of the spliced display panel by using the anisotropic conductive adhesive electrically connecting the bound parts between display panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A spliced display device, comprising a plurality of display panels stitched to each other, and each of the display panels has a display region and a non-display region;
wherein the spliced display device comprises at least one first display panel and at least one second display panel, an end of the first display is backwardly bended away display surface at a boundary between the display region and the non-display region, and an end of the second display panel is adjacent to the first display panel, and the end of the second display panel facing and correspondingly fixed to the non-display region of the first display panel after bended;
wherein a substrate positioned on bottom of the first display panel and/or the second display panel is flexible substrate;
wherein the first display panel is organic-light-emitting display panel, which comprises a substrate, an organic light emitting layer positioned on the substrate, and a package layer for packaging the organic light emitting layer on surface of the substrate;
wherein the end of the second display panel which adjacent to the first display panel is backwardly bended away display surface at boundary between the display region and the non-display region, and the non-display region of the first display panel and the non-display region of the second display panel are facing and correspondingly fixed to each other after respectively bended;
wherein the spliced display device further comprises a conductive element, two bending parts of the substrates of the display panels are corresponding to each other and respectively has a first bound part, the conductive element is connected between the two adjacent first bound parts of the substrates.

2. The spliced display device according to claim 1, wherein the spliced display device further comprises a second bound part positioned away splicing portion on the substrate of periphery of the display panel, the conductive element is positioned between same rows or same columns of the display panels.

3. The spliced display device according to claim 2, wherein the second bound part is positioned on two adjacent lateral sides of the spliced display device.

4. A spliced display device, comprising a plurality of display panels stitched to each other, and each of the display panels has a display region and a non-display region;
wherein the spliced display device comprises at least one first display panel and at least one second display panel, an end of the first display is backwardly bended away display surface at a boundary between the display region and the non-display region, and an end of the second display panel is adjacent to the first display panel, and the end of the second display panel facing and correspondingly fixed to the non-display region of the first display panel after bended;
wherein a substrate positioned on bottom of the first display panel and/or the second display panel is flexible substrate;
wherein the first display panel is organic-light-emitting display panel, which comprises a substrate, an organic light emitting layer positioned on the substrate, and a package layer for packaging the organic light emitting layer on surface of the substrate;
wherein the organic light emitting layer is positioned in the display region of the first display panel, the end of the second display panel is facing to the bended package layer of the first display panel;
wherein the end of the second display panel which adjacent to the first display panel is backwardly bended away display surface at boundary between the display region and the non-display region, and the non-display region of the first display panel and the non-display region of the second display panel are facing and correspondingly fixed to each other after respectively been bended;
wherein the spliced display device further comprises a conductive element, two bending parts of the substrates of the display panels are corresponding to each other and respectively has a first bound part, the conductive element is connected between the two adjacent first bound parts of the substrates.

5. The spliced display device according to claim 4, wherein the spliced display device further comprises a second bound part positioned away splicing portion on the substrate of periphery of the display panel, the conductive element is positioned between same rows or same columns of the display panels.

6. The spliced display device according to claim 5, wherein the second bound part is positioned on two adjacent lateral sides of the spliced display device.

7. A spliced display device, comprising a plurality of display panels stitched to each other, and each of the display panels has a display region and a non-display region;
wherein the spliced display device comprises at least one first display panel and at least one second display panel, an end of the first display is backwardly bended away display surface at a boundary between the display region and the non-display region, and an end of the second display panel is adjacent to the first display panel, and the end of the second display panel facing and correspondingly fixed to the non-display region of the first display panel after bended;
wherein a substrate positioned on bottom of the first display panel and/or the second display panel is flexible substrate;
wherein the first display panel is organic-light-emitting display panel, which comprises a substrate, an organic light emitting layer positioned on the substrate, and a package layer for packaging the organic light emitting layer on surface of the substrate;
wherein the organic light emitting layer is positioned in the display region of the first display panel, the end of the second display panel is facing to the bended package layer of the first display panel;
wherein adherence area between the package layers of a bending parts of the first display panels is greater than area of a non-bending part of the first display panel;
wherein the end of the second display panel which adjacent to the first display panel is backwardly bended away display surface at boundary between the display region and the non-display region, and the non-display region of the first display panel and the non-display region of the second display panel are facing and correspondingly fixed to each other after respectively been bended;
wherein the spliced display device further comprises a conductive element, two bending parts of the substrates of the display panels are corresponding to each other and respectively has a first bound part, the conductive element is connected between the two adjacent first bound parts of the substrates.

8. The spliced display device according to claim 7, wherein the spliced display device further comprises a second bound part positioned away splicing portion on the substrate of periphery of the display panel, the conductive element is positioned between same rows or same columns of the display panels.

9. The spliced display device according to claim 8, wherein the second bound part is positioned on two adjacent lateral sides of the spliced display device.

* * * * *